United States Patent
Hsu

(10) Patent No.: US 7,078,291 B2
(45) Date of Patent: Jul. 18, 2006

(54) METHOD FOR FABRICATING A DEEP TRENCH CAPACITOR

(75) Inventor: Ping Hsu, Chung-Ho (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 355 days.

(21) Appl. No.: 10/707,261

(22) Filed: Dec. 2, 2003

(65) Prior Publication Data

US 2005/0118776 A1 Jun. 2, 2005

(51) Int. Cl.
*H01L 21/8242* (2006.01)
*H01L 21/20* (2006.01)

(52) U.S. Cl. .................. 438/249; 438/248; 438/244; 438/392; 438/391; 438/389; 257/303

(58) Field of Classification Search ......... 438/243–249, 438/386–392; 257/301–305
See application file for complete search history.

(56) References Cited

U.S. PATENT DOCUMENTS

| 6,221,735 | B1 | * | 4/2001 | Manley et al. | 438/426 |
| 6,368,912 | B1 | * | 4/2002 | Chang et al. | 438/248 |
| 6,552,382 | B1 | * | 4/2003 | Wu | 257/305 |
| 6,815,307 | B1 | * | 11/2004 | Hsu et al. | 438/386 |
| 2005/0001256 | A1 | * | 1/2005 | Chen et al. | 257/301 |

* cited by examiner

*Primary Examiner*—Jennifer M. Kennedy
(74) *Attorney, Agent, or Firm*—Winston Hsu

(57) ABSTRACT

This invention pertains to a method for making a trench capacitor of DRAM devices. A single-sided spacer is situated on the sidewall of a recess at the top of the trench capacitor prior to the third polysilicon deposition and recess etching process. The single-sided spacer is formed on the second polysilicon layer and collar oxide layer. Then, the third polysilicon deposition and recess etching process is carried out to form a third polysilicon layer on the second polysilicon layer. Dopants of the third polysilicon layer are blocked from diffusing to the substrate by the single-sided spacer.

7 Claims, 14 Drawing Sheets

METHOD FOR FABRICATING A DEEP TRENCH CAPACITOR

BACKGROUND OF INVENTION

1. Field of the Invention

The present invention relates to a semiconductor process, and more particularly, to a process of manufacturing a deep trench capacitor of a DRAM device.

2. Description of the Prior Art

Trench-capacitor DRAM devices are known in the art. A trench-storage capacitor typically consists of a very-high-aspect-ratio contact-style hole pattern etched into the substrate, a thin storage-node dielectric insulator, a doped low-pressure chemical vapor deposition (LPCVD) polysilicon fill, and buried-plate diffusion in the substrate. The doped LPCVD silicon fill and the buried plate serve as the electrodes of the capacitor. A dielectric isolation collar in the upper region of the trench prevents leakage of the signal charge from the storage-node diffusion to the buried-plate diffusion of the capacitor.

In general, the prior art method for fabricating a trench capacitor of a DRAM device may include several major manufacture phases as follows:

Phase 1: deep trench etching.

Phase 2: buried plate and capacitor dielectric (or node dielectric) forming.

Phase 3: first polysilicon deep trench fill and first recess etching.

Phase 4: collar oxide forming.

Phase 5: second polysilicon deposition and second recess etching.

Phase 6: third polysilicon deposition and third recess etching.

Phase 7: shallow trench isolation (hereinafter referred to as "STI") forming.

Please refer to FIG. 1 to FIG. 3. FIG. 1 is a schematic diagram illustrating an enlarged portion of a typical deep trench capacitor in cross-sectional view along line NN of FIG. 2. FIG. 2 shows the normal layout of the active areas (hereinafter referred to as "AA") and deep trench capacitors (hereinafter also referred to as "DT") 11 and 12 without DT-AA misalignment after accomplishing STI process, wherein perspective buried strap out diffusion 16 is shown. FIG. 3 depicts misaligned AA and DT layout after accomplishing STI process. Referring initially to FIG. 1, two adjacent deep trench capacitors (DT) 11 and 12 are fabricated in a semiconductor substrate 10, wherein each of which is comprised of a buried plate 13, node dielectric 14, poly stack storage node (Poly1/Poly2/Poly3). As known to those skilled in the art, the buried plate 13 acts as a first electrode of the deep trench capacitor, and the poly stack storage node (Poly1/Poly2/Poly3), which is electrically isolated from the buried plate 13 by the node dielectric 14, acts as a second electrode of the deep trench capacitor. Typically, the second polysilicon layer (Poly2) of the poly stack storage node (Poly1/Poly2/Poly3) is electrically from the surrounding substrate 10 by a so-called collar oxide 15. The deep trench capacitors 11 and 12 are electrically connected to respective access transistors (not shown), which are formed on the active areas 26, via the buried strap out diffusions 16. The deep trench capacitor 11 is electrically isolated from the deep trench capacitor 12 by the STI 20.

As the size of a memory cell shrinks, the chip area available for a single memory cell becomes very small. This causes reduction in capacitor area on a single chip and therefore leads to problems such as inadequate capacitance and large electrode resistance. In FIG. 1, two essential parameters are defined: X and L, wherein the parameter "X" stands for the maximum distance in the overlapping region between AA and DT in the x-direction, and the parameter "L" stands for the maximum distance of the DT in the x-direction subtracts the parameter "X". In other words, the maximum width of the DT in the x-direction is the combination of the parameters "X" and "L". It is often desired that to minimize the electrode resistance, the parameter "L" is kept as small as possible, while the parameter "X" is kept as large as possible. Larger "X" means longer AA region, and smaller "L" means narrower STI between two adjacent deep trench capacitors. Referring to FIG. 3, unfortunately, small "L" often leads to M-DT misalignment when defining AA and STI areas, and therefore causes capacitor charge leakage via diffusion region 17 as shown in dash line circle. When AA-DT misalignment occurs, the conductive diffusion region 17 is formed in the area between two adjacent deep trench capacitors 11 and 12, in which a STI is supposed to embedded therein for isolating the two adjacent deep trench capacitors 11 and 12.

Please refer to FIG. 4 and FIG. 5. FIG. 4 and FIG. 5 are schematic cross-sectional diagrams showing several intermediate steps of forming a prior art deep trench capacitor, which are relative to the present invention. As shown in FIG. 4, a substrate 10 having a pad oxide layer 26 and a pad nitride layer 28 thereon is provided. After deep trench etching, an $N^+$ buried plate 13 and a node dielectric layer 14 are sequentially formed in the deep trench. A first polysilicon deposition and recess process is then carried out to form a first poly layer (Poly1) at the bottom of the deep trench. A collar oxide layer 15 is formed on sidewall of the deep trench above Poly1. A second polysilicon deposition and recess process is then carried out to form a second poly layer (Poly2) atopPoly1. As shown in FIG. 5, the collar oxide layer 15 that is not covered by Poly 2 is stripped off to expose the sidewall of the deep trench. Subsequently, a third polysilicon deposition and recess process is carried out to form a third poly layer (Poly3) atopPoly2. Dopants of the heavily doped Poly2 diffuse out through Poly3 to the surrounding substrate 10 to form an annular shaped buried strap out diffusion 16. Finally, a conventional STI process is performed to isolate the two adjacent deep trench capacitors, thereby forming the structure as set forth in FIG. 1.

SUMMARY OF INVENTION

The primary objective of the present invention is to provide a novel method for fabricating a trench capacitor of DRAM devices, thereby solving prior art AA-DT misalignment problem during STI process and reducing resistance of the capacitor electrode.

According to this invention, a method for fabricating a trench capacitor is disclosed. A substrate having thereon a pad oxide layer and a pad nitride layer is provided. A deep trench is formed by etching the pad nitride layer, the pad oxide layer, and the substrate. The deep trench is then doped to form a buried diffusion plate in the substrate at a lower portion of the deep trench. A node dielectric layer is deposited in the deep trench. A first polysilicon deposition and recess etching is performed to embed a first polysilicon layer on the node dielectric layer at the lower portion of the deep trench, and the first polysilicon layer having a top surface, wherein the d top surface of the first polysilicon layer and sidewall of the deep trench define a first recess. A collar oxide layer is formed on sidewall of the first recess. A second polysilicon deposition and recess etching is performed to embed a second polysilicon layer on the first polysilicon layer. The collar oxide layer that is not covered by the second polysilicon layer is removed to expose the substrate at an upper portion of the deep trench. The top surface of the second polysilicon layer and the exposed substrate define a second recess. The second recess is filled with a spacer material layer. A photoresist layer is formed on the spacer material layer. The photoresist layer masks a portion of the spacer material layer. The spacer material layer that is not covered by the photoresist layer is anisotropically etched to form a single-sided spacer on sidewall of the second recess. A third polysilicon deposition and recess etching is then performed to embed a third polysilicon layer on the second polysilicon layer and the collar oxide layer.

It is to be understood that both the foregoing general description and the following detailed description are exemplary, but are not restrictive, of the invention. Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
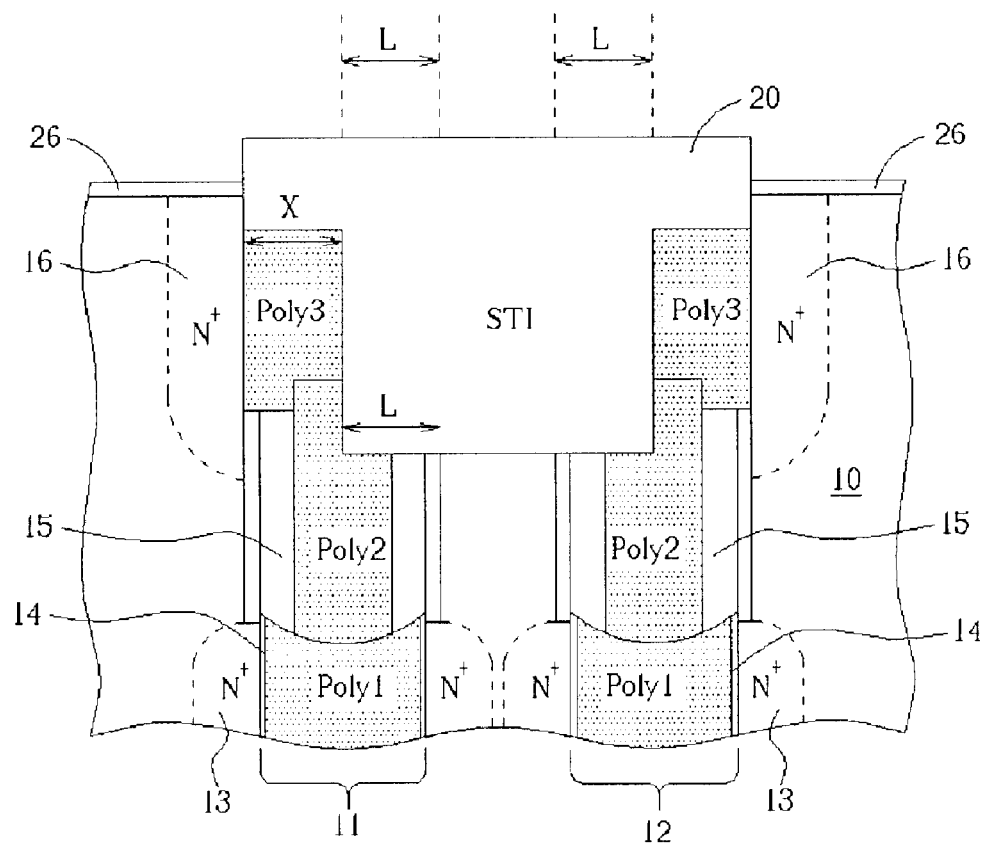
FIG. 1 is a schematic diagram illustrating an enlarged portion of a typical deep trench capacitor in cross-sectional view along line NN of FIG. 2.
Figure 2:
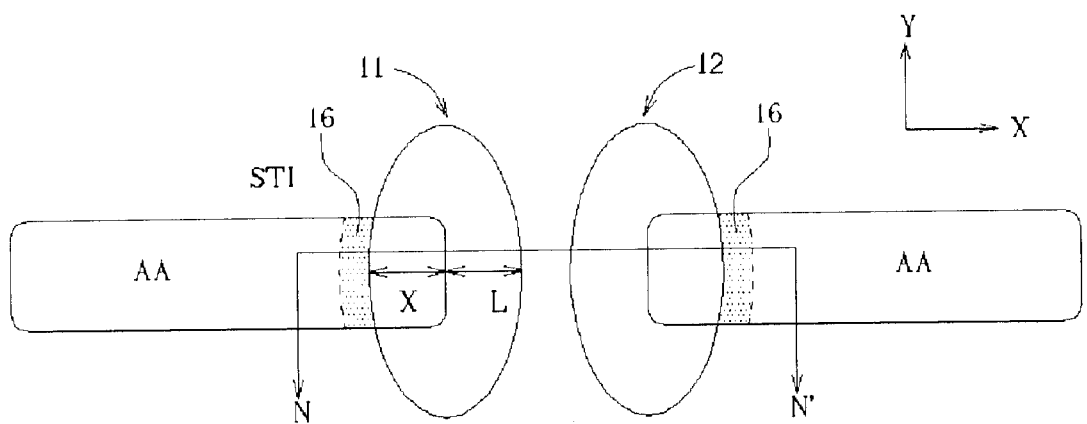
FIG. 2 shows the normal AA and DT layout without DT-AA misalignment after accomplishing STI process, wherein perspective buried strap out diffusion 16 is shown.
Figure 3:
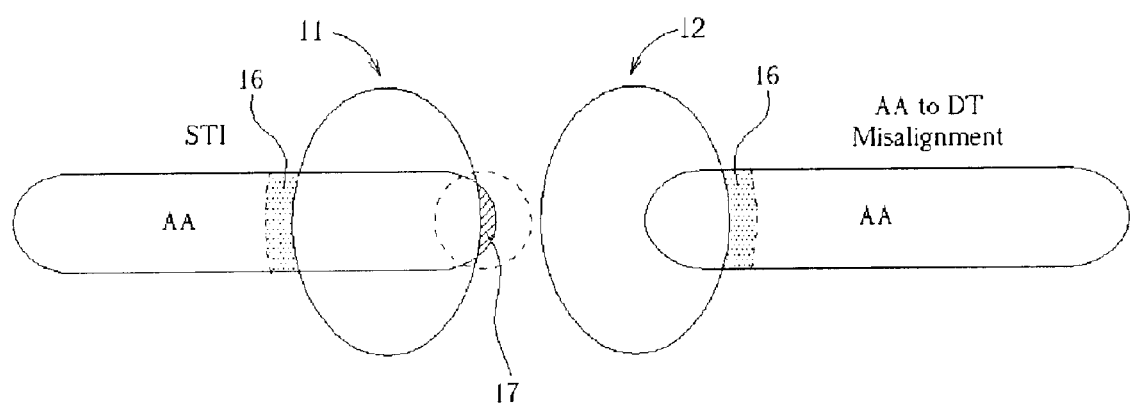
FIG. 3 depicts misaligned AA and DT layout after accomplishing STI process, wherein perspective buried strap out diffusion 16 and excess conductive diffusion 17 are shown.
Figure 4:
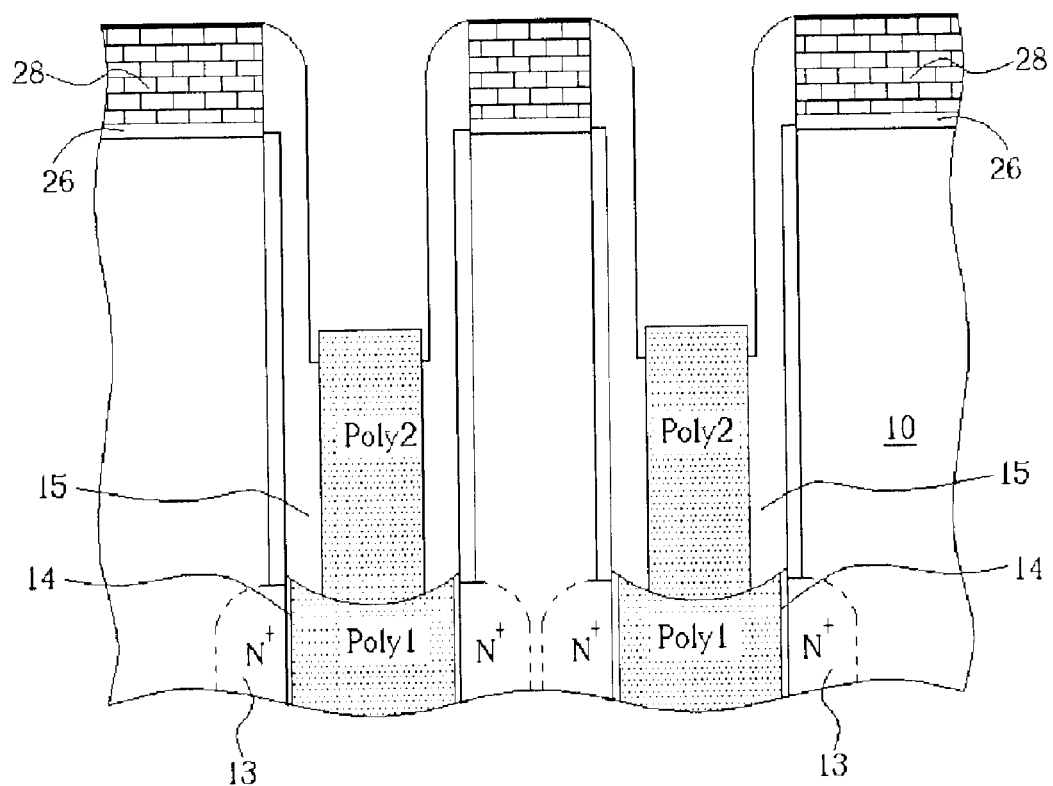
FIG. 4 and FIG. 5 are schematic cross-sectional diagrams showing several intermediate steps of forming a prior art deep trench capacitor.
Figure 5:
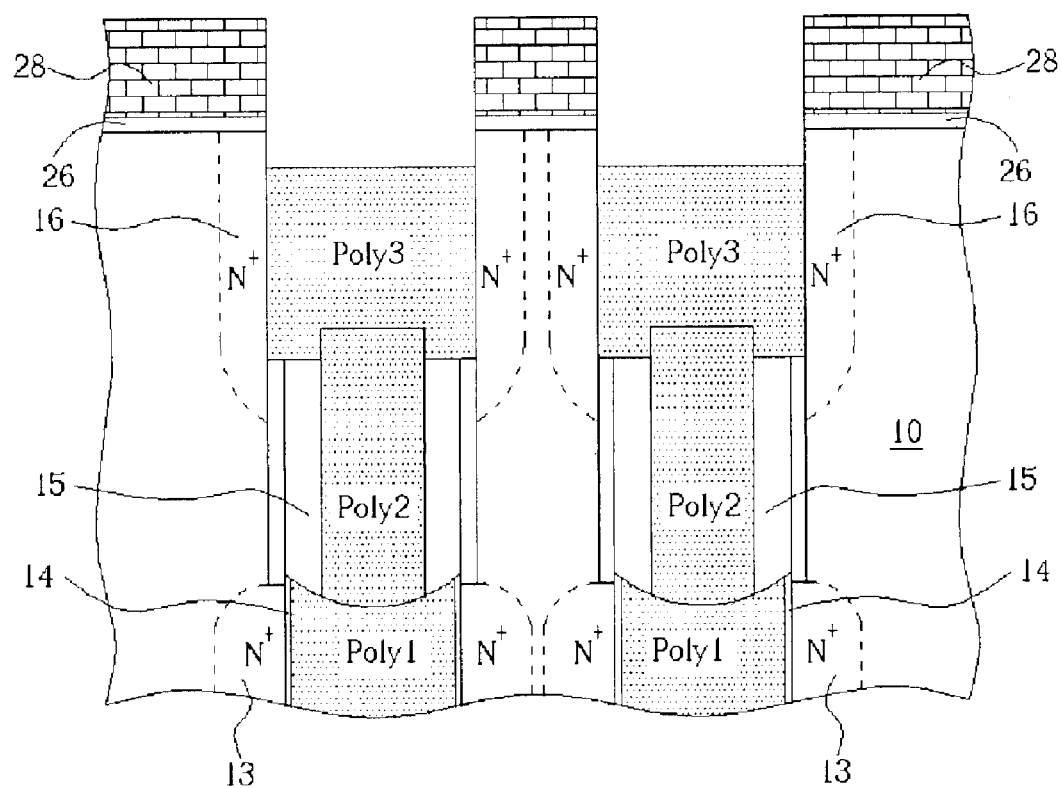
Figure 6:
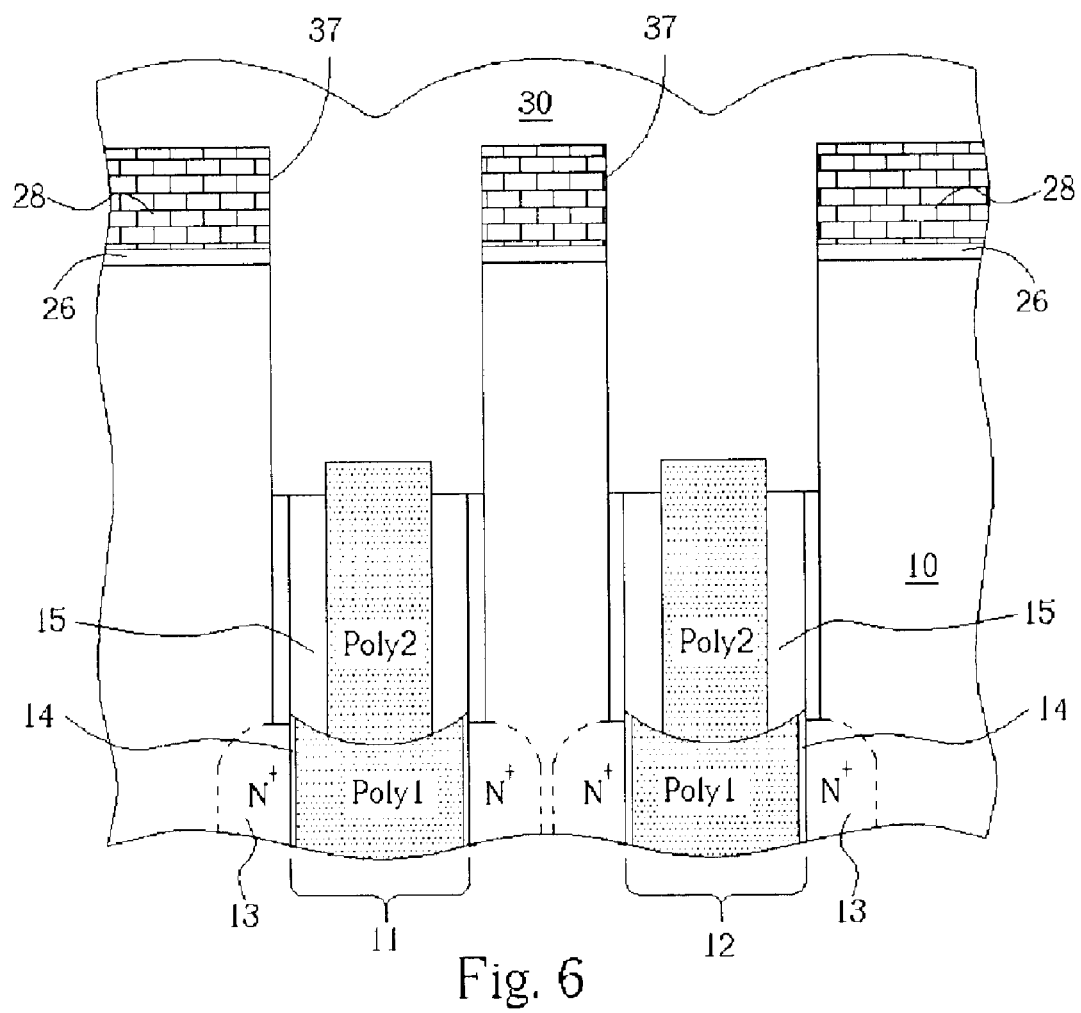
FIG. 6 to FIG. 9 are schematic cross-sectional diagrams showing the manufacture steps of making a deep trench capacitor in accordance with the first preferred embodiment of the present invention.

Please refer to FIG. 6 to FIG. 10. FIG. 6 to FIG. 10 are schematic cross-sectional diagrams showing the manufacture steps of making a deep trench capacitor in accordance with the first preferred embodiment of the present invention, in which like reference numerals designate similar or corresponding elements, regions, and portions. As shown in FIG. 6, a semiconductor substrate 10 such as a silicon substrate is provided. A pad oxide layer 26 and a pad nitride layer 28 are formed on a main surface of the semiconductor substrate 10. A dry etching process is carried out to form a deep trench in the semiconductor substrate 10. A buried plate 13 adjacent to the deep trench and a node dielectric layer 14 are formed. A first polysilicon deposition and recess process is carried out to form a first poly layer (Poly1) at the bottom of the deep trench. A collar oxide layer 15 is formed on sidewall of the deep trench above Poly1. A second polysilicon deposition and recess process is then carried out to form a second poly layer (Poly2) atopPoly1. The method of forming the buried plate 13 comprises the steps of depositing a thin layer of arsenic silicate glass (ASG) at a lower portion of the deep trench, followed by thermal drive in. It is understood that other doping methods such as gas phase doping (GPD) or the like may be employed. The node dielectric layer 14 may be oxide-nitride (ON) or oxide-nitride-oxide (ONO), but not limited thereto. The collar oxide layer 15 that is not covered by Poly 2 is stripped off to expose the sidewall of the deep trench, thereby forming a recess opening 37. Thereafter, a chemical vapor deposition (CVD), such as high-density plasma CVD (HDPCVD), is performed to deposit a CVD oxide layer 30 on the semiconductor substrate 10. The CVD oxide layer 30 overlies the pad nitride layer 28 and fills the recess opening 37.

Figure 7:
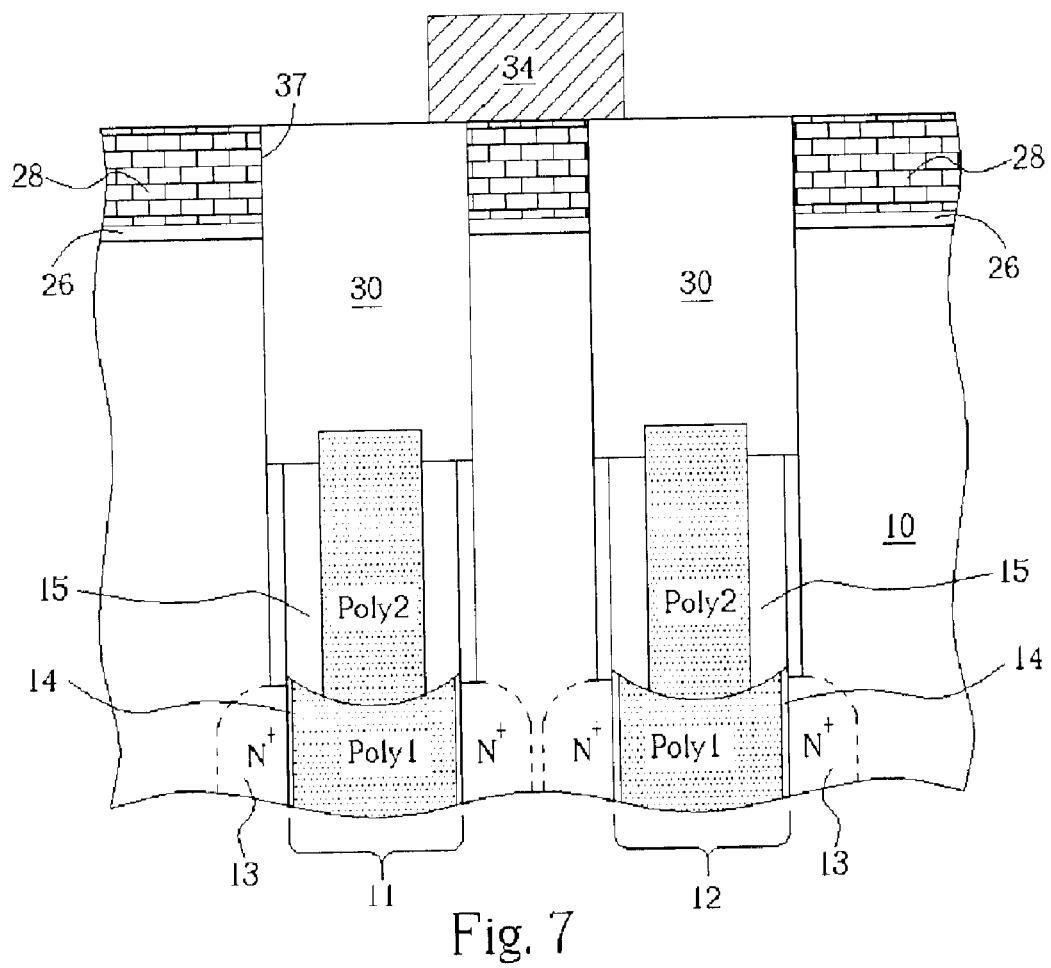

As shown in FIG. 7, the CVD oxide layer 30 is planarized by methods known in the art. For example, using the pad nitride layer 28 as a polish stop, a conventional chemical mechanical polishing process is performed remove the CVD oxide layer outside the recess opening 37. A photoresist 34 is formed on the planar surface of the substrate and masks a portion of the remaining CVD oxide layer 30 embedded in the recess opening 37.

Figure 8:
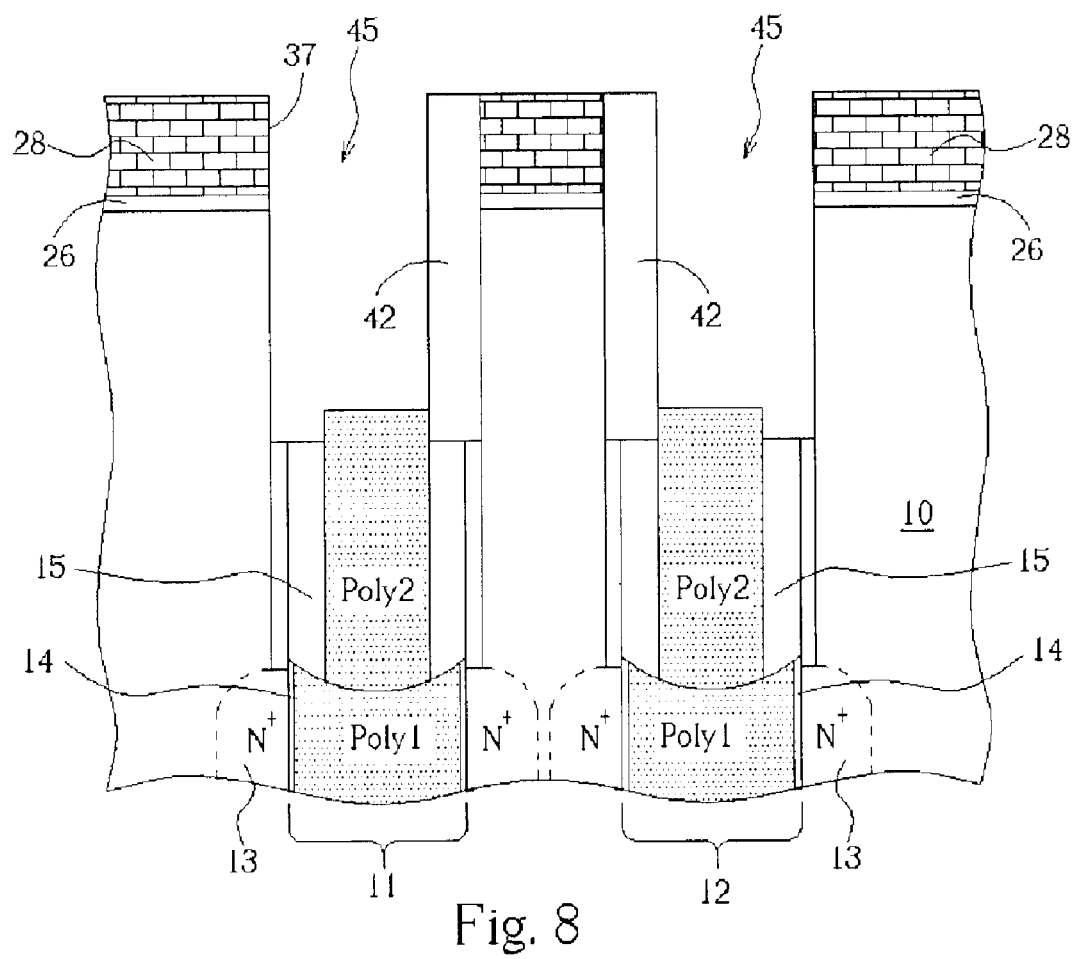

As shown in FIG. 8, using the photoresist 34 and the pad nitride layer 28 as an etching mask, an anisotropic etching process is carried out to etch away the CVD oxide layer 30 that is not masked by the photoresist 34, thereby forming a single-sided silicon oxide spacer 42 on the sidewall of the upper portion of the deep trench above the collar oxide layer 15 and a recess opening 45. The recess opening 45 is substantially defined by the surface of the single-sided silicon oxide spacer 42, the exposed surface of the sidewall of the upper portion of the deep trench above the collar oxide layer 15, and the top surface of Poly2. As specifically indicated, the single-sided silicon oxide spacer 42 masks a portion of the sidewall of the upper portion of the deep trench above the collar oxide layer 15 that is adjacent to a most neighboring deep trench. The remaining photoresist 34 is then stripped off.

Figure 9:
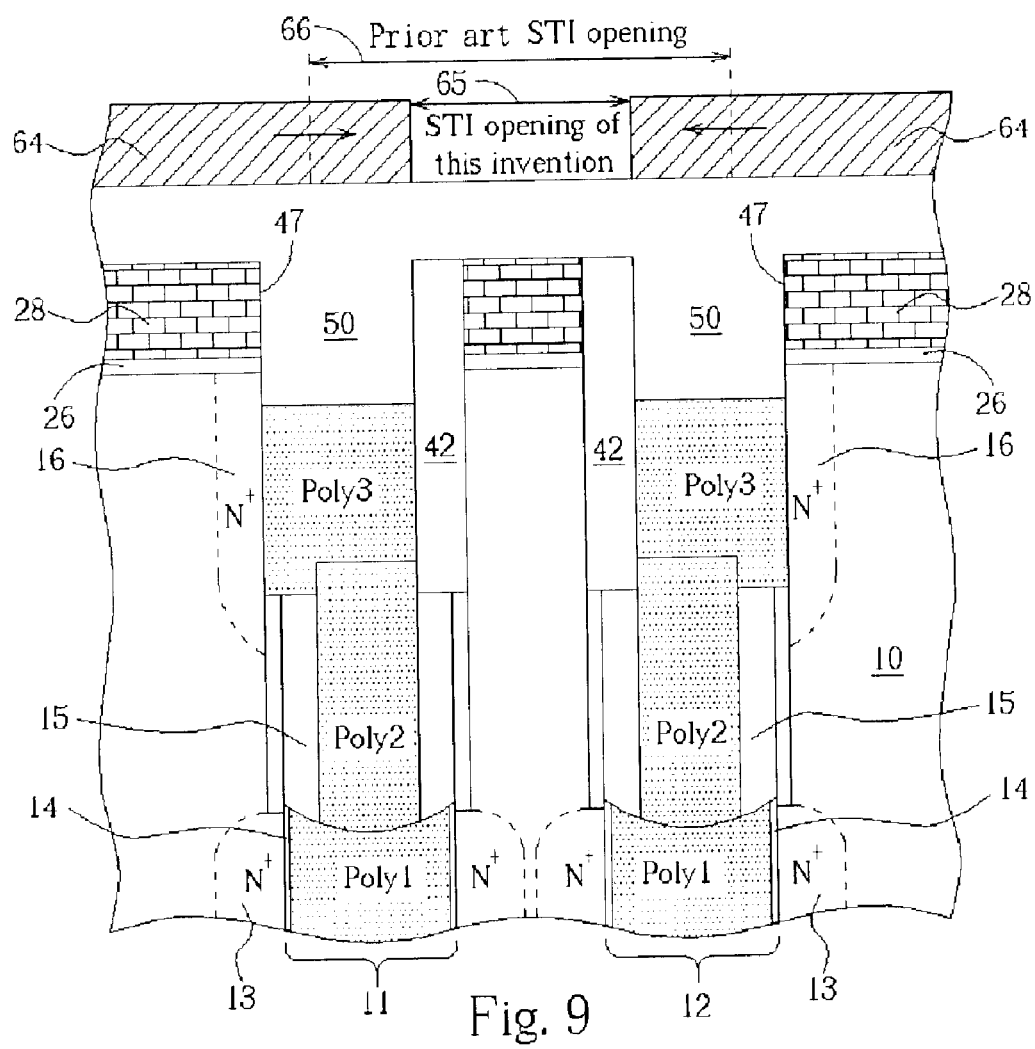
Figure 10:
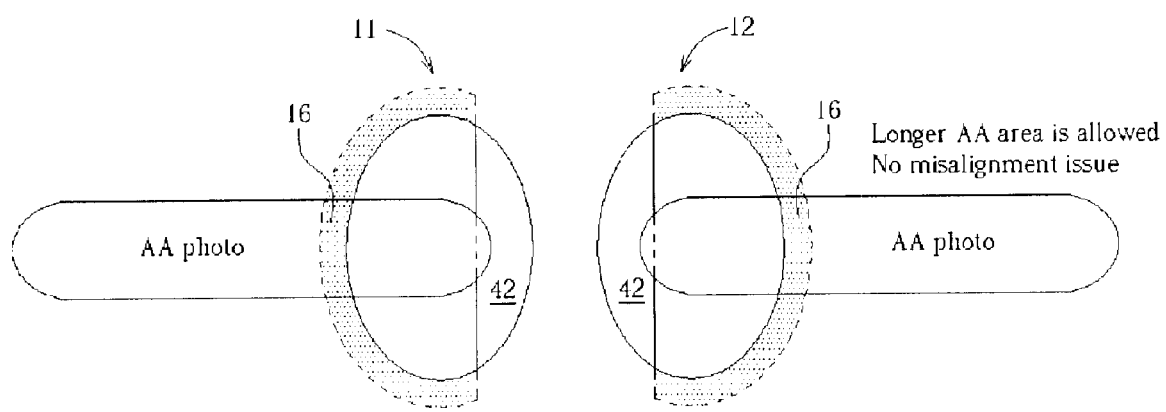
FIG. 10 is a top view of FIG. 9 in a state before STI etching process, wherein the perspective non-annular buried strap out diffusion 16 and unique single-sided spacer 42 are illustrated.

As shown in FIG. 9, according to the first preferred embodiment of the present invention, a third polysilicon deposition and recess process is carried out to form a third polysilicon layer (Poly3) atopPoly2. First, a CVD polysilicon layer is deposited over the substrate 10 and fills the recess opening 45. The polysilicon layer is recessed to a predetermined depth for example 100~500 angstroms below the surface of the semiconductor substrate 10 to form a recess opening 47. Dopants of the heavily doped Poly2 diffuse out through Poly3 to the surrounding substrate 10 that is not masked by the single-sided spacer 42 to form a non-annular buried strap out diffusion 16. Finally, an STI process is carried out. First, a borosilicate glass (BSG) layer 50 is deposited over the substrate 10 and fills the recess opening 47. An AA photoresist 64 is formed on the BSG layer 50 to define the active areas. The AA photoresist 64 has therein an STI opening 65 defining the STI region to be etched into the substrate 10. A prior art STI opening 66 as indicated by dash lines is also depicted in FIG. 9 to compare with the STI opening 65 of the present invention. It is shown that due to the existence of the single-sided spacer 42, the STI opening 65 between two adjacent deep trenches can be very small. It is noted that smaller STI opening 65 between two adjacent deep trenches means longer active area pattern, as shown in FIG. 10.

Referring briefly back to FIG. 9, the following steps include anisotropic etching the BSG layer 50, the single-sided spacer 42, the pad nitride/pad oxide layers 26 and 28, the semiconductor substrate 10, and a portion of Poly3 through the STI opening 65 to form a STI recess (not shown), and thereafter removing the remaining AA photoresist 64.

Figure 11:
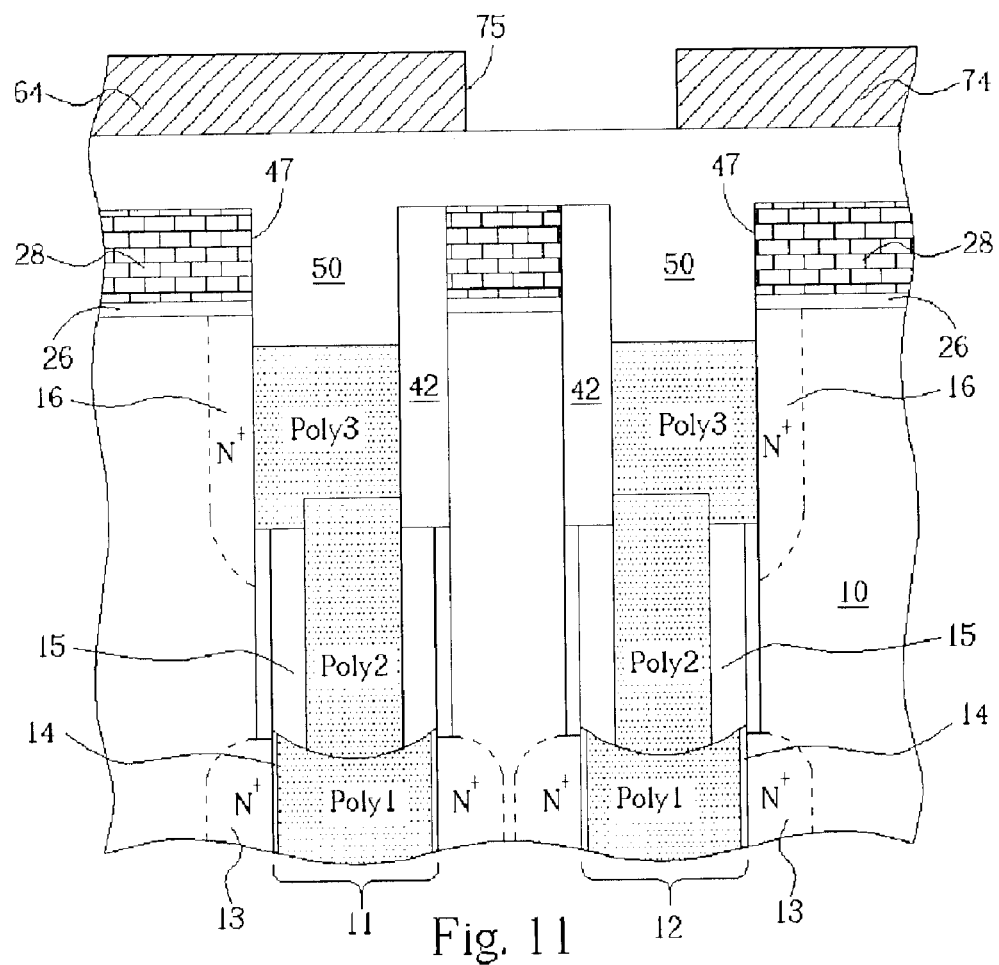
FIG. 11 is a schematic cross-sectional diagram illustrating the STI process in accordance with the second preferred embodiment of the present invention.
Figure 12:
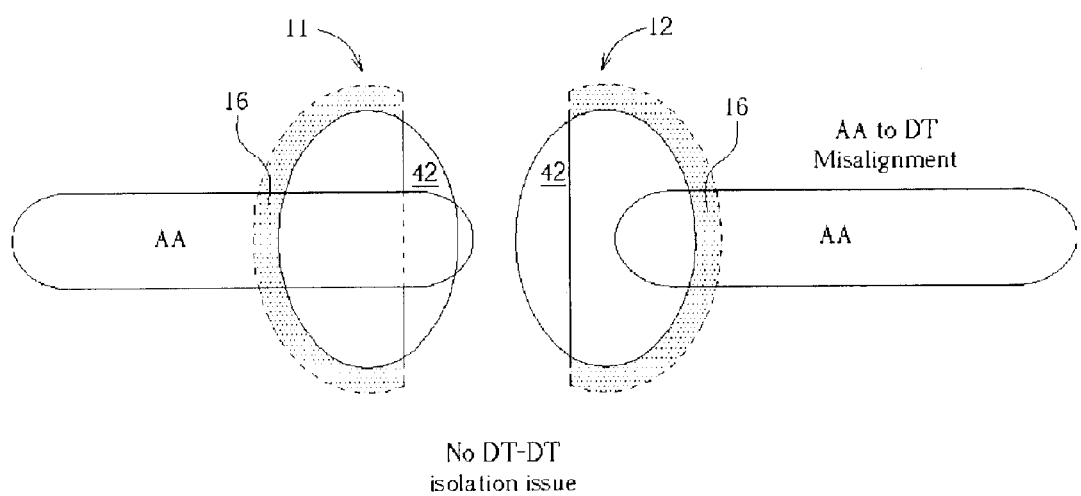
FIG. 12 is a top view of FIG. 11 in a DT-AA misaligned state before STI etching process, wherein the perspective non-annular buried strap out diffusion 16 and unique single-sided spacer 42 are illustrated.

Please refer to FIG. 11 and FIG. 12, with reference to FIG. 8. FIG. 11 is a schematic cross-sectional diagram illustrating the STI process in accordance with the second preferred embodiment of the present invention. FIG. 12 is a top view of FIG. 11 in a DT-AA misaligned state before STI etching process, wherein the perspective non-annular buried strap out diffusion 16 and unique single-sided spacer 42 are illustrated. Likewise, after forming the single-sided spacer 42 and recess opening 45 as set forth in FIG. 8, the photoresist 34 is removed. A third polysilicon deposition and recess process is carried out to form a third polysilicon layer (Poly3) atop Poly2. First, a CVD polysilicon layer (not shown) is deposited over the substrate 10 and fills the recess opening 45. The CVD polysilicon layer is recessed to a predetermined depth below the surface of the semiconductor substrate 10 to form a recess opening 47. Dopants of the heavily doped Poly2 diffuse out through Poly3 to the surrounding substrate 10 that is not masked by the single-sided spacer 42 to form a non-annular buried strap out diffusion 16. Finally, an STI process is carried out. Next, as shown in FIG. 11, a borosilicate glass (BSG) layer 50 is deposited over the substrate 10 and fills the recess opening 47. An AA photoresist 74 is formed on the BSG layer 50 to define the active areas. The AA photoresist 74 has therein a misaligned STI opening 75 defining the STI region to be etched into the substrate 10. The process window is increased when performing STI process. As shown in FIG. 12, DT-AA misalignment when performing STI process can be tolerated because of the single-sided spacer 42.

Figure 13:
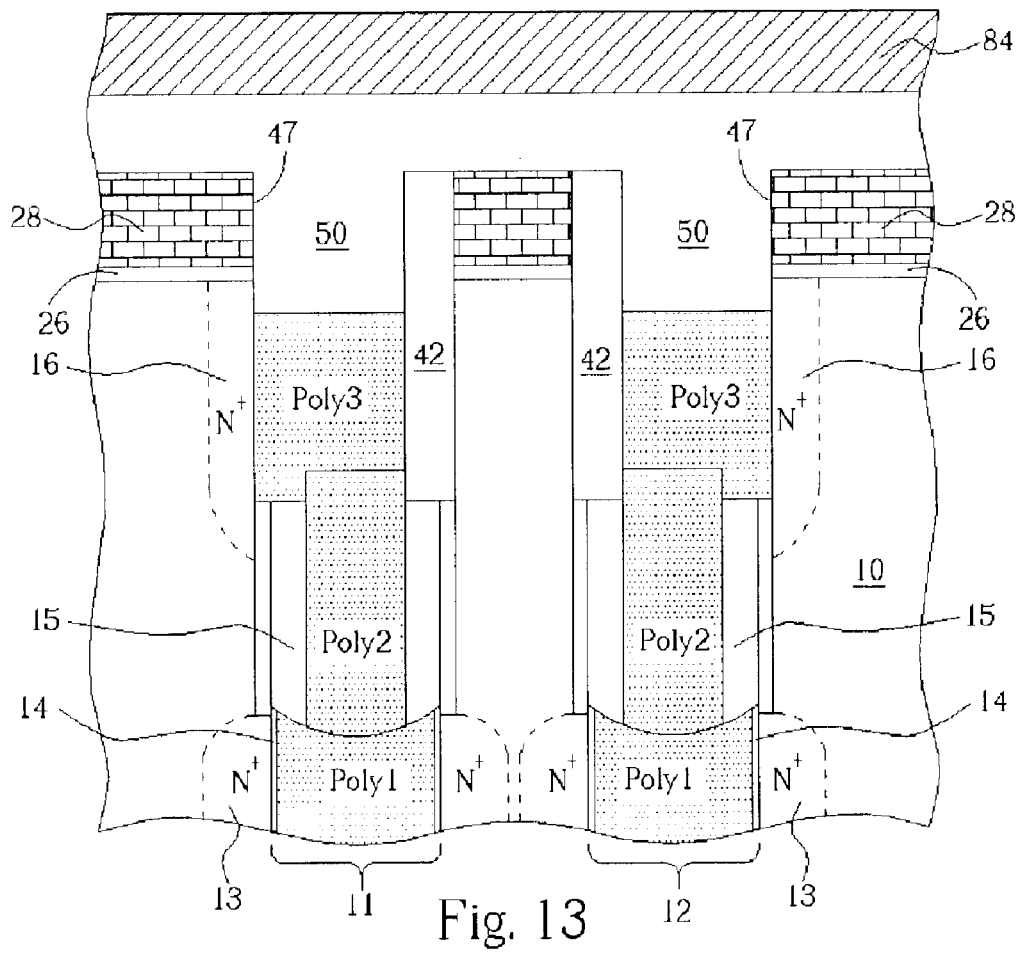
FIG. 13 is a schematic cross-sectional diagram illustrating the STI process in accordance with the third preferred embodiment of the present invention.
Figure 14:
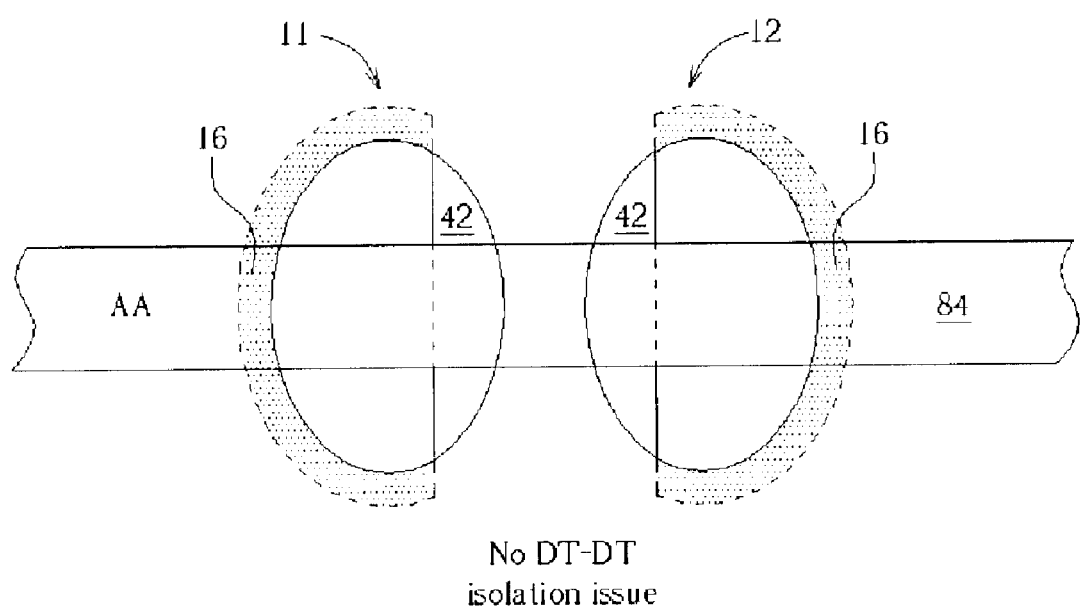
FIG. 14 is a top view of FIG. 13, wherein the perspective non-annular buried strap out diffusion 16 and unique single-sided spacer 42 are illustrated.

Please refer to FIG. 13 with reference to FIG. 8. FIG. 13 is a schematic cross-sectional diagram illustrating the STI process in accordance with the third preferred embodiment of the present invention. As shown in FIG. 8, after forming the single-sided spacer 42 and recess opening 45, the photoresist 34 is removed. A third polysilicon deposition and recess process is carried out to form a third polysilicon layer (Poly3) atop Poly2. First, a CVD polysilicon layer (not shown) is deposited over the substrate 10 and fills the recess opening 45. The CVD polysilicon layer is recessed to a predetermined depth below the surface of the semiconductor substrate 10 to form a recess opening 47. Dopants of the heavily doped Poly2 diffuse out through Poly3 to the surrounding substrate 10 that is not masked by the single-sided spacer 42 to form a non-annular buried strap out diffusion 16. Next, as shown in FIG. 13, an STI process is carried out. First, a borosilicate glass (BSG) layer 50 is deposited over the substrate 10 and fills the recess opening 47. An AA photoresist 84 is formed on the BSG layer 50 to define the active areas. Please refer to FIG. 14. FIG. 14 is a top view of FIG. 13. As shown in FIG. 14, the AA photoresist 84 is a strap across two adjacent deep trenches.

Those skilled in the art will readily observe that numerous modifications and alterations of the present invention method may be made while retaining the teachings of the invention. Accordingly, the above disclosure should be construed as limited only by the metes and bounds of the appended claims.

What is claimed is:

1. A method for fabricating a trench capacitor, comprising:

providing a substrate having thereon a pad oxide layer and a pad nitride layer;

etching in order of said pad nitride layer, said pad oxide layer, and said substrate to form a deep trench;

doping said deep trench to form a buried diffusion plate in said substrate at a lower portion of said deep trench;

lining said deep trench with a node dielectric layer;

performing a first polysilicon deposition and recess etching to embed a first polysilicon layer on said node dielectric layer at said lower portion of said deep trench, and said first polysilicon layer having a top surface, wherein said top surface of said first polysilicon layer and sidewall of said deep trench define a first recess;

forming a collar oxide layer on sidewall of said first recess;

performing a second polysilicon deposition and recess etching to embed a second polysilicon layer on said first polysilicon layer;

removing said collar oxide layer that is not covered by said second polysilicon layer to expose said substrate at an upper portion of said deep trench, and wherein a top surface of said second polysilicon layer and said exposed substrate define a second recess;

filling said second recess with a spacer material layer;

forming a photoresist layer on said spacer material layer, and said photoresist layer masking a portion of said spacer material layer;

anisotropically etching said spacer material layer not covered by said photoresist layer, to form a single-sided spacer on the sidewall of said second recess; and performing a third polysilicon deposition and recess etching to embed a third polysilicon layer on said second polysilicon layer and said collar oxide layer, wherein dopants of said third polysilicon layer diffuse out to the surrounding substrate that is not masked by said single-sided spacer to form a non-annular buried strap out diffusion.

2. The method of claim 1 wherein said substrate is a silicon substrate.

3. The method of claim 1 wherein said deep trench has a depth that is larger than 6 microns below a surface of said substrate.

4. The method of claim 1 wherein doping said deep trench to form a buried diffusion plate in said substrate involves the use of an arsenic silicate glass (ASG) film.

5. The method of claim 1 wherein said node dielectric is an oxide-nitride-oxide (ONO) dielectric layer.

6. The method of claim 1 wherein said spacer material layer is silicon dioxide.

7. The method of claim 6 wherein said silicon dioxide is formed by chemical vapor deposition (CVD) method.

* * * * *